(12) United States Patent
Slocum et al.

(10) Patent No.: US 8,053,683 B2
(45) Date of Patent: Nov. 8, 2011

(54) EQUIPMENT CONTAINER RETENTION AND BONDING SYSTEM AND METHOD

(75) Inventors: Douglas A. Slocum, New Milford, PA (US); John G. Davis, Vestal, NY (US); Jamey Kelsall, Rome, PA (US); John A. Stubecki, Nichols, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 348 days.

(21) Appl. No.: 12/413,637

(22) Filed: Mar. 30, 2009

(65) Prior Publication Data

US 2010/0243312 A1    Sep. 30, 2010

(51) Int. Cl.
*H01R 4/00* (2006.01)
*H05K 9/00* (2006.01)

(52) U.S. Cl. .......... 174/365; 174/372; 174/385; 174/51; 174/541; 174/542

(58) Field of Classification Search ................... 174/365, 174/372, 377, 385, 51, 541, 542; 361/816
See application file for complete search history.

(56) References Cited

U.S. PATENT DOCUMENTS

| | | | |
|---|---|---|---|
| 3,710,476 A | 1/1973 | Hollingsead et al. | |
| 3,783,173 A | 1/1974 | Twomey | |
| 4,889,959 A * | 12/1989 | Taylor et al. | 174/351 |
| RE33,283 E | 7/1990 | Hollingsead et al. | |
| 5,190,241 A | 3/1993 | Pease | |
| 5,290,191 A | 3/1994 | Foreman et al. | |
| 5,524,908 A | 6/1996 | Reis | |
| 5,847,938 A | 12/1998 | Gammon | |
| 6,094,358 A * | 7/2000 | Christensen et al. | 361/785 |
| 6,111,192 A * | 8/2000 | Bell et al. | 174/384 |
| 6,201,704 B1 * | 3/2001 | Poplawski et al. | 361/753 |
| 6,563,042 B2 * | 5/2003 | Barabash | 174/359 |
| 6,661,677 B1 * | 12/2003 | Rumney | 361/818 |
| 6,927,973 B2 * | 8/2005 | Song et al. | 361/679.33 |
| 7,107,034 B2 | 9/2006 | Davis | |
| 7,245,498 B2 * | 7/2007 | Togami et al. | 361/753 |
| 7,656,681 B2 * | 2/2010 | Tracewell | 361/800 |
| 2003/0121686 A1* | 7/2003 | Barabash | 174/350 |
| 2005/0007749 A1* | 1/2005 | Barringer et al. | 361/818 |

\* cited by examiner

*Primary Examiner* — Hung Ngo
(74) *Attorney, Agent, or Firm* — Burr & Brown

(57) ABSTRACT

An equipment container retention and bonding system including a dagger pin block assembly that includes a mounting dagger pin and a bonding member formed of a compressive electrically conductive material that is retained on a surface of the dagger pin block assembly wherein the bonding member is compressed between the contact surface on the equipment container and the dagger pin block assembly when the fastening mechanism secures the equipment container in the mounting tray to form an EMI/EMC bonding connection between the mounting tray and the equipment container having an electrical resistance of less than 2.5 milli-ohms under vibration and other loading conditions encountered during use of the system.

24 Claims, 3 Drawing Sheets

(a)

(b)

EQUIPMENT CONTAINER RETENTION AND BONDING SYSTEM AND METHOD

STATEMENT OF GOVERNMENT INTEREST

The Government of the United States of America has rights in this invention pursuant to contract no. N00019-03-G-0014/0009, awarded by the United States Navy (USN).

BACKGROUND OF THE INVENTION

Space is often limited for vehicle-mounted equipment boxes containing electronic equipment. To efficiently use the available space, the vehicle-mounted equipment boxes are frequently designed to fit within a small area with very little clearance between the equipment boxes being mounted and other equipment boxes in the surrounding space. The close proximity of equipment boxes makes it difficult to access and securely tighten fasteners to secure the equipment boxes. One way of mounting the equipment boxes in a small area with very little clearance is using dagger pins that are typically mounted in the bottom or least accessible portion of the equipment box mounting area.

The equipment boxes also typically require an electrical bonding path for grounding the equipment box. Frequently, the dagger pin has been used to provide the electrical bonding path for grounding the equipment box. However, while dagger pins are effective for securing equipment boxes in vehicles, dagger pins do not provide a reliable electrical bonding path due to interface tolerances necessary to permit equipment box alignment and installation on the dagger pins. Since both non-spring loaded mounting dagger pins and spring loaded mounting dagger pins rely on direct surface-to-surface physical contact between the dagger pin and contact plate to form the electrical bonding path, the resulting electrical bonding path is frequently intermittent even under non-vibration environment conditions. This results in an ineffective Electrical Magnetic Interference/Electrical Magnetic Compatibility (EMI/EMC) shielding of the equipment box, which can cause unstable operation of the electronics in the equipment box.

Further, the electrical resistance of the ground path provided by existing dagger pins is typically significantly greater than 2.5 milli-ohms, which is the desired upper limit. Vibrations that may be present during operation in a vehicle environment exacerbate the intermittent electrical bonding path problem.

Prior attempts to solve this problem have included using electrically conductive spring fingers, non-painted contact surfaces and bonding straps. The electrically conductive spring fingers are not effective because the electrically conductive spring fingers can lose resiliency and can break without warning, particularly under the vibration conditions present during operation in a vehicle, in addition, using electrically conductive spring fingers requires retrofit of existing electronics boxes with hard conductive pads positioned to interface with the electrically conductive spring fingers. Using non-painted contact surfaces is also not desirable because they cause the bare surfaces of the equipment box and bare portions of the mounting structure to be much less corrosion resistant and more subject to wear, and surface corrosion on these surfaces causes intermittent loss of bonding, especially under vibration and load conditions. Bonding straps also are not desirable because these add additional hardware and requires modification of the equipment boxes and the vehicle mounting structure, and add additional steps for the removal and installation of the equipment boxes, which is not desirable.

What is needed is a system and method for providing a reliable electrical bonding path for equipment boxes under non-vibratory and vibratory conditions to ensure proper operation of electronic equipment contained in vehicle-mounted equipment boxes without major modification to the equipment boxes or the vehicle mounting structure.

SUMMARY OF THE INVENTION

According to a first aspect of the present invention, there is provided an equipment container electronics box retention and bonding system comprising a mounting tray, a dagger pin block assembly and at least one fastening mechanism positioned to engage the equipment container on the side directly opposite to the mounting dagger pin for securing the equipment container in the mounting tray. The dagger pin block assembly comprising a mounting dagger pin and a bonding member retained on a surface of the dagger pin block assembly through which the mounting dagger pin extends, and the bonding member is formed of a compressive electrically conductive material. The mounting tray including at least one electrically conductive pad with the dagger pin block assembly being secured to the mounting tray and in contact with the at least one electrically conductive pad. The equipment container electronics box including at least one contact surface located on an exterior surface of the equipment container, the contact surface being formed of an electrically conductive material and having an alignment hole in a central portion thereof. When the fastening mechanism secures the equipment container in the mounting tray, the mounting dagger pin of the dagger pin block assembly engages in the alignment hole in the at least one contact surface on the equipment container electronics box to form an EMI/EMC bonding connection between the mounting tray and the equipment container having an electrical resistance of less than 2.5 milli-ohms under vibration conditions encountered during use of the system.

The system and method of the present invention is significantly better than existing electrical bonding methods because the created bonding path is reliably formed having an electrical resistance of less than 2.5 milli-ohms, which is a desired upper limit, without requiring any special provisions or modifications to existing equipment containers, vehicle mounting trays or mounting structures. Further, the electrical bonding connection does not require any tools or loose hardware, such as bonding straps.

In some embodiments of the present invention, the bonding member is retained on the surface of the dagger pin block assembly by captive hardware. In other embodiments, the bonding member is retained on the surface of the dagger pin block assembly by ring-shaped hardware that attaches to the surface of the dagger pin block assembly. In other embodiments, the bonding member is retained on the surface of the dagger pin block assembly by screws that are retained in the dagger pin block assembly by locking inserts.

In some embodiments, the equipment container retention and bonding mounting system retains the bonding member on the surface of the dagger pin block assembly by at least one flange on the surface of the dagger pin block assembly that retainably engages at least a portion of bonding member. In another embodiment, the dagger pin block assembly further comprises a groove formed in the surface of the dagger pin block assembly that retainably engages at least a portion of the compressible bonding member, wherein the bonding member is retained on the surface of the dagger pin block assembly in a groove formed in the surface of the dagger pin block assembly that retainably engages at least a portion of the bonding member.

In other embodiments of the equipment container retention and bonding mounting system, the bonding member is retained on the surface of the dagger pin block assembly by a clamshell retaining mechanism that attaches to one or more surfaces of the dagger pin block assembly.

In some embodiments of the present invention, the bonding member is formed of at least one conductive metal such as, aluminum, silver, titanium, copper, brass, steel, steel plated with copper, tin or alloys thereof. The thickness of the bonding member is larger than the tolerance gap of the retention hardware. In some embodiments, the thickness of the bonding member is between ⅛ inch and ¼ inch.

According to a second aspect of the present invention, there is provided an avionics line replaceable unit (LRU) or weapons replacement assembly (WRA) retention and bonding system comprising a mounting tray that includes at least one electrically conductive pad and at least one swing bolt fastening mechanism and a dagger pin block assembly comprising a mounting dagger pin and a bonding member retained on the surface of the dagger pin block assembly through which the mounting dagger pin extends, wherein the bonding member is formed of a compressive electrically conductive material. The dagger pin block assembly being secured directly to at least one electrically conductive pad on the mounting tray. The avionics line replaceable unit (LRU) or weapons replacement assembly (WRA) comprising at least one contact surface formed of an electrically conductive material and having an alignment hole in a central portion of the at least one contact surface that is located on an exterior surface of the avionics LRU. The swing bolt fastening mechanism positioned to engage the avionics LRU on the side directly opposite to the mounting dagger pin for securing the avionics LRU in the mounting tray with the mounting dagger pin engaging in the alignment hole in the at least one contact surface. When the swing bolt fastening mechanism secures the avionics LRU in the mounting tray, the bonding member is compressed between the at least one contact surface on the avionics LRU and the dagger pin block assembly to form an EMI/EMC bonding connection between the mounting tray and the avionics LRU having an electrical resistance of less than 2.5 milli-ohms under vibration conditions encountered during use of the system.

In some embodiments of the equipment container retention and bonding mounting system, the bonding member is retained on the surface of the dagger pin block assembly by captive hardware. In other embodiments, the bonding member is retained on the surface of the dagger pin block assembly by ring-shaped hardware that attaches to the surface of the dagger pin block assembly. In other embodiments, the bonding member is retained on the surface of the dagger pin block assembly by keepers fastened with screws that are retained in the dagger pin block assembly by locking inserts.

In some embodiments, the equipment container retention and bonding mounting system retains the bonding member on the surface of the dagger pin block assembly by at least one flange on the surface of the dagger pin block assembly that retainably engages at least a portion of bonding member. In other embodiments, the dagger pin block assembly further comprises a groove formed in the surface of the dagger pin block assembly that retainably engages at least a portion of the compressible bonding member, wherein the bonding member is retained on the surface of the dagger pin block assembly in a groove formed in the surface of the dagger pin block assembly that retainably engages at least a portion of the bonding member.

In other embodiments of the equipment container retention and bonding mounting system, the bonding member is retained on the surface of the dagger pin block assembly by a clamshell retaining mechanism that attaches to one or more surfaces of the dagger pin block assembly.

In some embodiments of the present invention, the bonding member is formed of at least one conductive metal such as, aluminum, silver, titanium, copper, brass, steel, steel plated with copper, tin or alloys thereof. The thickness of the bonding member is larger than the tolerance gap of the retention hardware. In one embodiment, the thickness of the bonding member is between ⅛ inch and ¼ inch.

According to a third aspect of the present invention, there is provided a method of forming an EMI/EMC bonding connection between the mounting tray and the equipment container comprising the steps of securing at least one dagger pin block assembly directly to at least one electrically conductive pad on the mounting tray, the at least one dagger pin block assembly comprising a mounting dagger pin and a bonding member retained on the surface of the dagger pin block assembly through which the mounting dagger pin extends, placing the equipment container on the mounting tray, securing the equipment to the mounting tray using the fastening mechanism positioned to engage the equipment container on the side directly opposite to the mounting dagger pin and the bonding member of the at least one dagger pin block assembly, wherein the mounting dagger pin engages in an alignment hole in a contact surface on an exterior surface of the equipment container, and the bonding member is compressed between the contact surface and the dagger pin block assembly when the fastening mechanism secures the equipment container in the mounting tray to form an EMI/EMC bonding connection between the mounting tray and the equipment container having an electrical resistance of less than 2.5 milli-ohms under vibration conditions encountered during use of the system.

BRIEF DESCRIPTION OF THE DRAWINGS

For a fuller understanding of the nature and objects of the invention, reference should be made to the following detailed description of a preferred mode of practicing the invention, read in connection with the accompanying drawings in which.

DETAILED DESCRIPTION OF THE INVENTION

The equipment container electronics box retention and bonding system of the present invention provides a stable electrically conductive bonding path to ground for equipment container electronics boxes installed in a vehicle under vibration and other loading conditions encountered during use of the system. The equipment container electronics box includes an avionics line replaceable unit (LRU) or weapons replacement assembly (WRA).

Figure 1:
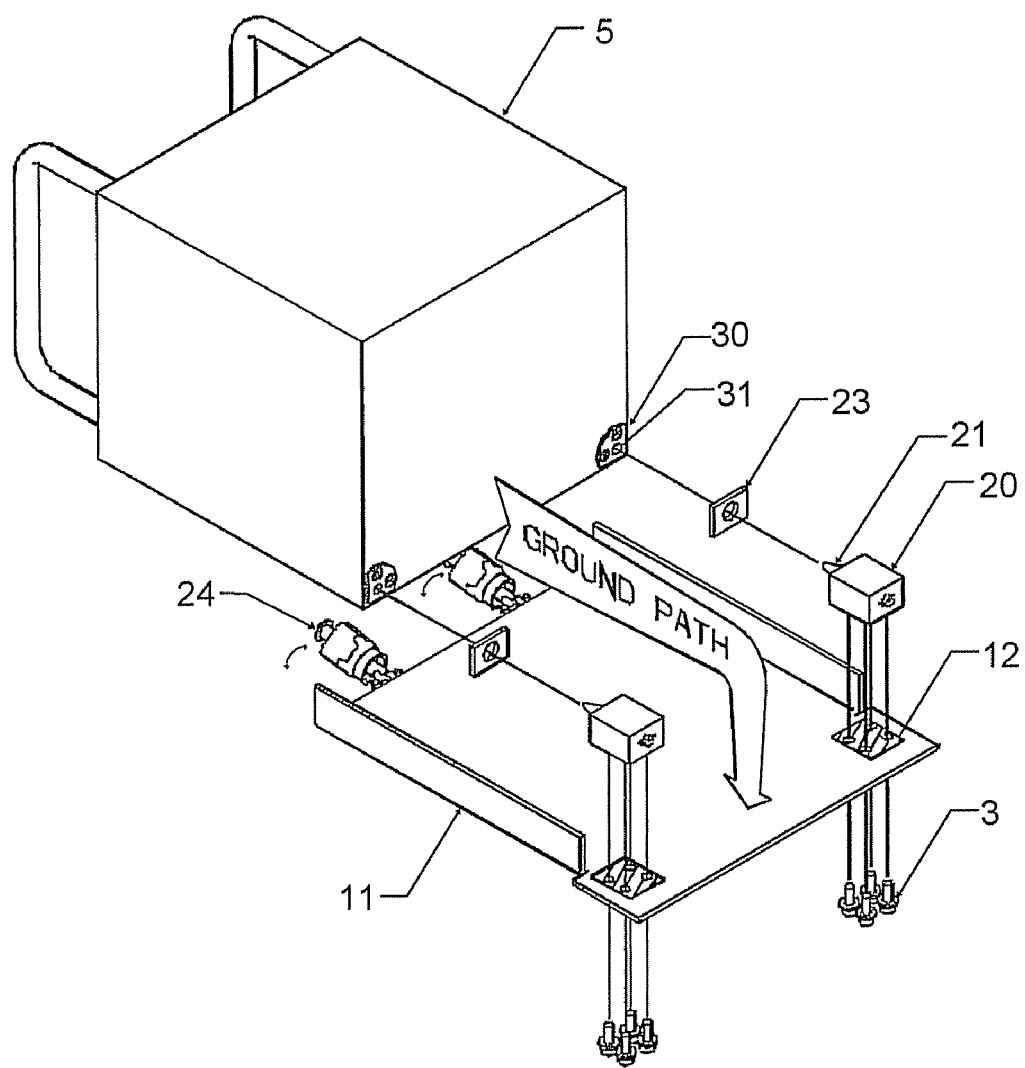
FIG. 1 depicts one embodiment of the equipment container electronics box retention and bonding system of the present invention.

As shown in FIG. 1, the equipment container electronics box retention and bonding system includes a mounting tray 11 and means for retaining the equipment container electronics box, such as a combination of a dagger pin block assembly 20 and fastening mechanism 24, such as swing bolts, that are positioned to engage the equipment container 5 on opposing sides to securely retain the equipment container.

Mounting tray 11 is typically fabricated of a metal, such as steel, aluminum, copper, brass, and alloys thereof. Mounting tray 11 includes at least one electrically conductive pad 12. Electrically conductive pads 12 are formed of a conductive metal, such as aluminum, silver, titanium, copper, brass, steel and alloys thereof, as well as steel plated with copper, tin of alloys thereof. Mounting tray 11, with the exception of electrically conductive pad 12, can also be formed of a non-metallic material having sufficient rigidity to support the equipment container electronics box under the load and vibration conditions expected to be encountered during operation in the vehicle.

The retention system includes a dagger pin block assembly 20 to retain one side of the equipment container 5 and at least one fastening mechanism 24 positioned to engage the equipment container electronics box on the side directly opposite the dagger pin block assembly 20, in the embodiment shown in FIG. 1. Dagger pin assembly 20 is fabricated of a conductive metal, such as aluminum, silver, titanium, copper, brass, steel and alloys thereof, as well as steel plated with copper, tin of alloys thereof. Dagger pin block assembly 20 is securely fastened to the mounting tray 11 by retaining hardware, such as screws 3, as shown in FIG. 1. Dagger pin block assembly can also be permanently attached to mounting tray 11.

Figure 2:
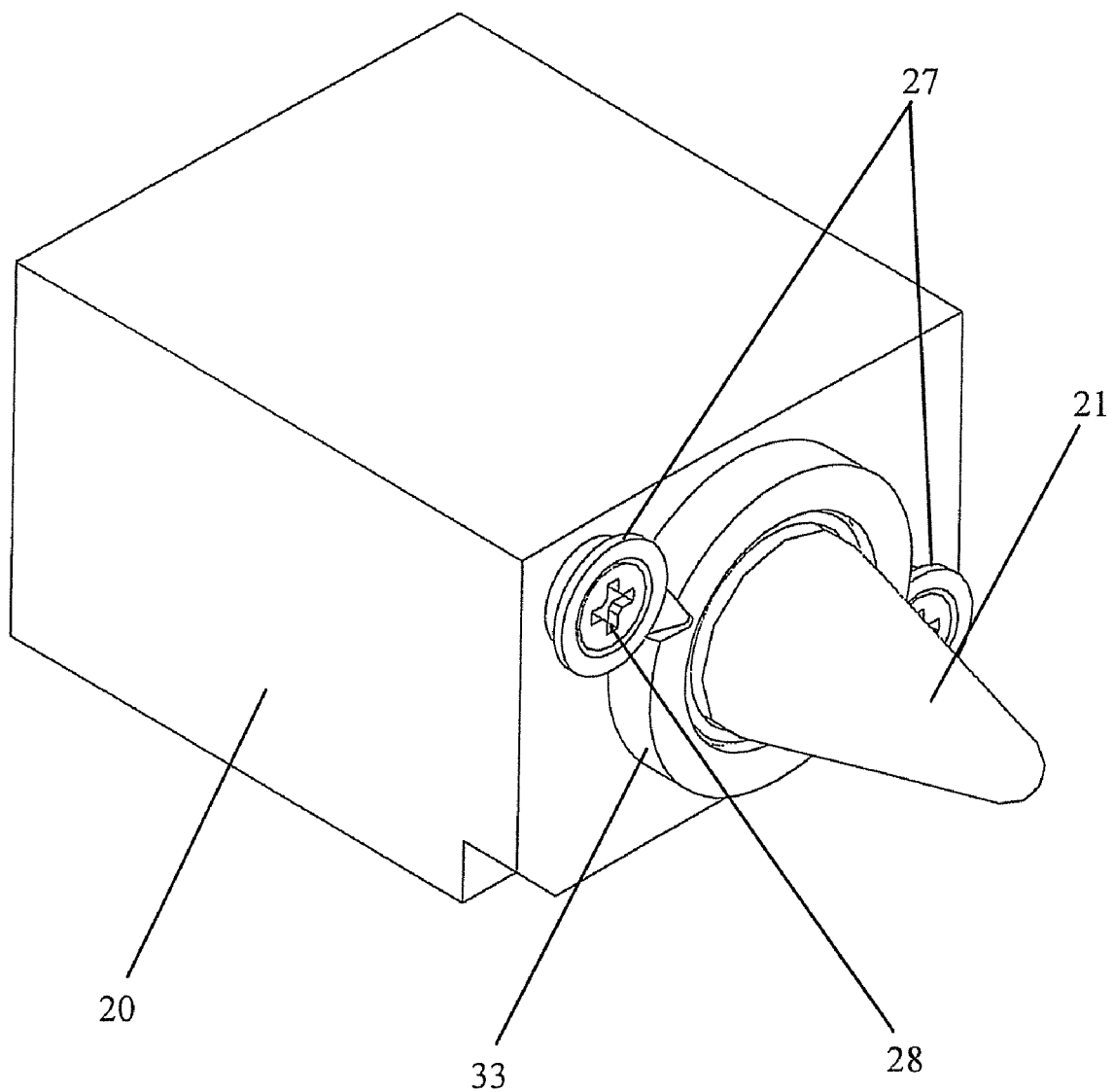
FIG. 2 depicts one embodiment of the dagger pin block bonding assembly of the present invention.

Dagger pin block assembly 20 includes mounting dagger pin 21 and bonding member 23. Mounting dagger pin 21 extends through bonding member 23 in the embodiment in FIG. 2. Dagger pin block 20 is fabricated of a conductive material such as aluminum, silver, titanium, copper, brass, steel and alloys thereof, as well as steel plated with copper, tin of alloys thereof. In one embodiment, the dagger pin block assembly 20 includes an electrically conductive ring 33 that surrounds the mounting dagger pin 21, as shown in FIG. 2.

Bonding member 23 is formed of a compressive electrically conductive material, such as a conductive metal, including aluminum, silver, titanium, copper, brass, steel and alloys thereof, as well as steel plated with copper, tin of alloys thereof. The thickness of bonding member 23 is significantly larger than the largest tolerance gap for dagger pin block assembly 20 and fastening mechanism 24. In one embodiment, bonding member 23 has a thickness of between ⅛ inch and ¼ inch. In another embodiment, bonding member is at least two times the largest tolerance gap.

The equipment container 5 includes at least one electrically conductive contact surface 30 located on an exterior surface of equipment container 5. Electrically conductive contact surface 30 is formed of a conductive metal such as aluminum, silver, titanium, copper, brass, steel and alloys thereof, as well as steel plated with copper, tin of alloys thereof. Electrically conductive contact surface 30 includes alignment hole 31 in a central portion thereof that is positioned on equipment container 5 to engage mounting dagger pin 21 of dagger pin block assembly 20 when equipment container 5 is securely fastened to mounting tray 11. In another embodiment, conductive contact surface 30 includes a plurality of alignment holes.

After mounting dagger pins 21 are engaged in alignment holes 31 of contact surface 30 on equipment container 5, the opposing end of equipment container 5 is secured to mounting tray 11 by extending fastening mechanism 24 through a corresponding retainer on equipment container 5 and mounting tray 11 and tightening fastening mechanism 24. Mounting tray 11, which is secured to the structure of the vehicle, provides the electrical bonding path to the vehicle mounting structure ground. Fastening mechanism 24, which including swing bolts, are typically at an angle substantially perpendicular to the center axis of the dagger pins when equipment container 5 is secured to mounting tray 11 to prevent movement of equipment container 5.

Figure 3:
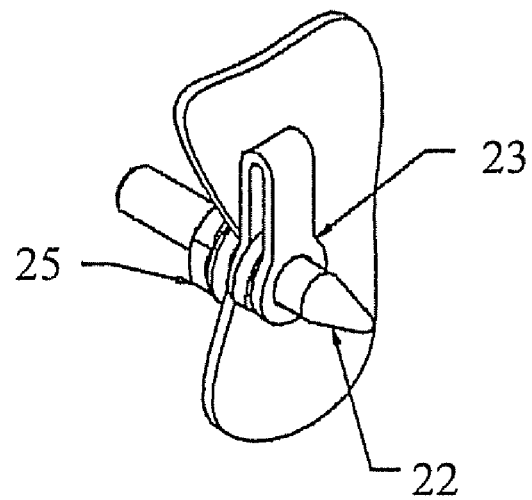
FIGS. 3(a) and 3(b) depict examples of different configurations of the dagger pin block bonding assembly of the present invention.
Figure 3:
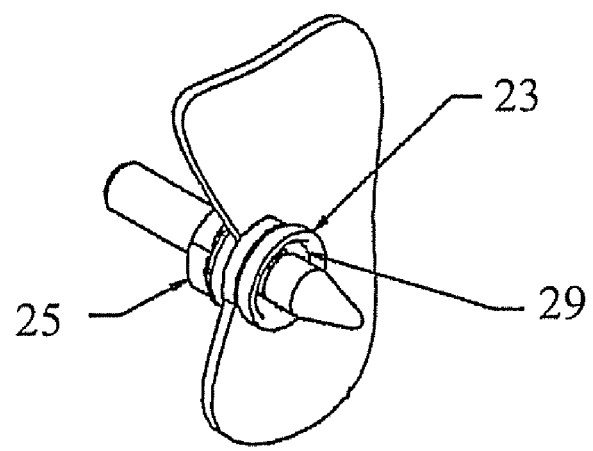

Bonding member 23 is retained on a surface of dagger pin block assembly 20 by retention hardware. In the embodiment shown in FIG. 2, captive hardware, such as locking inserts or keepers 27, and captive or keeper screws 28, securely fasten bonding member 23 to the surface dagger pin block assembly 20 by engaging at least an outer portion of bonding member 23. In another embodiment of the present invention, the mounting dagger pin is a shouldered dagger pin 22 and bonding member 23 is retained between the shoulder of shouldered dagger pin 22 and dagger pin retention nut 25 on dagger pin block 20, as shown in FIG. 3($a$). In yet another embodiment, the mounting dagger pin is a shouldered dagger pin 22 and bonding member 23 is retained between the shoulder of shouldered dagger pin 22 and retention spring clip 29, as shown in FIG. 3($b$).

Alternative embodiments for retaining bonding member 23 on the surface of dagger pin block assembly 20 include ring-shaped hardware that mounts on or attaches to the surface of dagger pin block assembly 20, at least one flange on the surface of dagger pin block assembly 20 that retainably engages at least a portion of bonding member 23, a groove formed in the surface of dagger pin block assembly 20 that engages at least an inner and/or outer portion of bonding member 23 to retain bonding member 23 on the surface of dagger pin block assembly 20, and a clamshell retaining mechanism, which attaches to one or more surfaces of dagger pin block assembly 20 and engages at least a portion of the inner and/or outer circumferential edges of bonding member 23 to retain bonding member 23 on the surface of dagger pin block assembly 20.

Bonding member 23 is compressed between the at least one contact surface 30 on equipment container 5 and dagger pin block assembly 20 when the fastening mechanism 24 secures equipment container 5 in mounting tray 11 to form an EMI/EMC bonding connection between mounting tray 11 and equipment container 5 having an electrical resistance of less than 2.5 milli-ohms under vibration and other loading conditions likely to be encountered during operation, without requiring significant modification to equipment container 5 or mounting tray 11. The compressible conductive material of bonding member 23 creates an effective and dependable electrical bonding connection between equipment container 5 and the vehicle mounting structure ground.

Further, a method of forming an EMI/EMC bonding connection between mounting tray 11 and equipment container 5 is disclosed, the disclosed method including the step of securing at least one dagger pin block assembly directly to at least one electrically conductive pad on the mounting tray, the at least one dagger pin block assembly 20, which includes mounting dagger pin 21 and bonding member 23. Mounting dagger pin 20 extends through bonding member 23, which is retained on the surface of dagger pin block assembly 20. The disclosed method further including the steps of placing equipment container 5 on mounting tray 11, securing equipment container 5 to mounting tray 11 by engaging mounting dagger pin 11 into alignment hole 31 on contact surface 30, which is mounted on an exterior surface of equipment container 5 and tightening fastening mechanism 24, which is positioned to engage equipment container 5 on the side directly opposite to mounting dagger pin assembly 20, wherein bonding member 23 is compressed between contact surface 30 and dagger pin block assembly 20 when fastening mechanism 24 secures equipment container 5 on mounting tray 11 to form an EMI/EMC bonding connection between mounting tray 11 and equipment container 5 having an electrical resistance of less than 2.5 milli-ohms under vibration conditions encountered during use of the system.

In the embodiment of the present invention shown in FIG. 1, mounting tray 11 and electrically conductive pads 12 are formed of a conductive steel alloy and paint or other rust inhibiting material covers the surface of mounting tray 11 except for electrically conductive pads 12. Mounting tray 11 is electrically connected and bonded to the vehicle through the equipment mounting rack to the vehicle structure. Dagger pin block assembly 20 includes mounting dagger pin 21 and bonding member 23 and mounting dagger pin 21 extends through bonding member 23, as shown in FIG. 2. As shown in FIG. 1, mounting dagger pin assembly 20 is securely mounted directly to electrically conductive pads 12 by screws 3.

In this embodiment, bonding member 23 is formed of a compressible conductive metal mesh and is retained on a surface of dagger pin block assembly 20 by captive or keeper screws 28 that are retained in dagger pin block assembly 20 by locking inserts, or keepers 27, as shown in FIG. 2.

It will be understood that various modifications and changes may be made in the present invention by those of ordinary skill in the art who have the benefit of this disclosure. All such changes and modifications fall within the spirit of this invention, the scope of which is measured by the following appended claims.

We claim:

1. An equipment container electronics box retention and bonding system comprising:
   a mounting tray comprising at least one electrically conductive pad and at least one fastening mechanism;
   at least one contact surface located on an exterior surface of the equipment container, said contact surface being formed of an electrically conductive material and having an alignment hole in a central portion thereof;
   a dagger pin block assembly comprising a mounting dagger pin and an electrically conductive bonding member retained on a surface of the dagger pin block assembly through which the mounting dagger pin extends, the dagger pin block assembly being secured to the mounting tray and in contact with the at least one electrically conductive pad;
   the at least one fastening mechanism positioned to engage the equipment container on the side directly opposite to the mounting dagger pin for securing the equipment container in the mounting tray with the mounting dagger pin engaging in the alignment hole in the at least one contact surface;
   wherein the bonding member is formed of a compressive electrically conductive material, and the bonding member is compressed between the at least one contact surface on the equipment container and the dagger pin block assembly when the at least one fastening mechanism secures the equipment container in the mounting tray to form an EMI/EMC bonding connection between the mounting tray and the equipment container having an electrical resistance of less than 2.5 milli-ohms under vibration conditions encountered during use of the system.

2. The equipment container retention and bonding mounting system of claim 1, wherein the bonding member is retained on the surface of the dagger pin block assembly by captive hardware.

3. The equipment container retention and bonding mounting system of claim 1, wherein the bonding member is retained on the surface of the dagger pin block assembly by ring-shaped hardware that attaches to the surface of the dagger pin block assembly.

4. The equipment container retention and bonding mounting system of claim 1, wherein the bonding member is retained on the surface of the dagger pin block assembly by keepers fastened with screws.

5. The equipment container retention and bonding mounting system of claim 4, wherein the screws are retained in the dagger pin block assembly by locking inserts.

6. The equipment container retention and bonding mounting system of claim 1, wherein the bonding member is retained on the surface of the dagger pin block assembly by at least one flange on the surface of the dagger pin block assembly that retainably engages at least a portion of bonding member.

7. The equipment container retention and bonding mounting system of claim 1, the dagger pin block assembly further comprising a groove formed in the surface of the dagger pin block assembly that retainably engages at least a portion of the compressible bonding member.

8. The equipment container retention and bonding mounting system of claim 1, wherein the bonding member is retained on the surface of the dagger pin block assembly in a groove formed in the surface of the dagger pin block assembly that retainably engages at least a portion of the bonding member.

9. The equipment container retention and bonding mounting system of claim 1, wherein bonding member is formed of at least one of conductive metals, aluminum, silver, titanium, copper, brass, steel, steel plated with copper, tin or alloys thereof.

10. The equipment container retention and bonding mounting system of claim 1, wherein the bonding member is retained on the surface of the dagger pin block assembly by a clamshell retaining mechanism that attaches to one or more surfaces of the dagger pin block assembly.

11. The equipment container retention and bonding mounting system of claim 1, wherein the thickness of the bonding member is larger than the tolerance gap of the retention hardware.

12. The equipment container retention and bonding mounting system of claim 11, wherein the thickness of the bonding member is between ⅛ inch and ¼ inch.

13. An avionics line replaceable unit (LRU) or weapons replacement assembly (WRA) retention and bonding system comprising:
   a mounting tray comprising at least one electrically conductive pad and at least one fastening mechanism;
   at least one contact surface formed of an electrically conductive material and having an alignment hole in a central portion of the at least one contact surface that is located on an exterior surface of the avionics LRU;
   a dagger pin block assembly comprising a mounting dagger pin and an electrically conductive bonding member retained on the surface of the dagger pin block assembly through which the mounting dagger pin extends, the dagger pin block assembly being secured directly to the at least one electrically conductive pad on the mounting tray;

a swing bolt fastening mechanism positioned to engage the avionics LRU on the side directly opposite to the mounting dagger pin for securing the avionics LRU in the mounting tray with the mounting dagger pin engaging in the alignment hole in the at least one contact surface in a snug but non-interfering manner;

wherein the bonding member is formed of a compressive electrically conductive material, and the bonding member is compressed between the at least one contact surface on the avionics LRU and the dagger pin block assembly when the swing bolt fastening mechanism secures the avionics LRU in the mounting tray to form an EMI/EMC bonding connection between the mounting tray and the avionics LRU having an electrical resistance of less than 2.5 milli-ohms under vibration conditions encountered during use of the system.

14. The equipment container retention and bonding mounting system of claim 13, wherein the bonding member is retained on the surface of the dagger pin block assembly by captive hardware.

15. The equipment container retention and bonding mounting system of claim 13, wherein the bonding member is retained on the surface of the dagger pin block assembly by ring-shaped hardware that attaches to the surface of the dagger pin block assembly.

16. The equipment container retention and bonding mounting system of claim 13, wherein the bonding member is retained on the surface of the dagger pin block assembly by keepers fastened with screws.

17. The equipment container retention and bonding mounting system of claim 16, wherein the screws are retained in the dagger pin block assembly by locking inserts.

18. The equipment container retention and bonding mounting system of claim 13, wherein the bonding member is retained on the surface of the dagger pin block assembly by at least one flange on the surface of the dagger pin block assembly that retainably engages at least a portion of bonding member.

19. The equipment container retention and bonding mounting system of claim 13, the dagger pin block assembly further comprising a groove formed in the surface of the dagger pin block assembly that retainably engages at least a portion of the compressible bonding member.

20. The equipment container retention and bonding mounting system of claim 13, wherein bonding member is formed of at least one of noble metals, aluminum, silver, titanium, copper, brass, steel, steel plated with copper, tin or alloys thereof.

21. The equipment container retention and bonding mounting system of claim 13, wherein the bonding member is retained on the surface of the dagger pin block assembly by a clamshell retaining mechanism that attaches to one or more surfaces of the dagger pin block assembly.

22. The equipment container retention and bonding mounting system of claim 13, wherein the thickness of the bonding member is larger than the tolerance gap of the retention hardware.

23. The equipment container retention and bonding mounting system of claim 22, wherein the thickness of the bonding member is between ⅛ inch and ¼ inch.

24. A method of forming an EMI/EMC bonding connection between the mounting tray and the equipment container comprising the steps of:

securing at least one dagger pin block assembly directly to at least one electrically conductive pad on the mounting tray, the at least one dagger pin block assembly comprising a mounting dagger pin and a bonding member retained on the surface of the dagger pin block assembly through which the mounting dagger pin extends;

placing the equipment container on the mounting tray;

securing the equipment to the mounting tray using the fastening mechanism positioned to engage the equipment container on the side directly opposite to the mounting dagger pin and the bonding member of the at least one dagger pin block assembly;

wherein the mounting dagger pin engages in an alignment hole in a contact surface on an exterior surface of the equipment container, and the bonding member is compressed between the contact surface and the dagger pin block assembly when the fastening mechanism secures the equipment container in the mounting tray to form an EMI/EMC bonding connection between the mounting tray and the equipment container having an electrical resistance of less than 2.5 milli-ohms under vibration conditions encountered during use of the system.

\* \* \* \* \*